(12) United States Patent
Gutta et al.

(10) Patent No.: US 8,988,259 B2
(45) Date of Patent: Mar. 24, 2015

(54) VOLTAGE GENERATOR, SWITCH AND DATA CONVERTER CIRCUITS

(71) Applicants: Avinash Gutta, Pondicherry (IN); Alan Gillespie, East Lothian (GB); Roderick McLachlan, Edinburgh (GB)

(72) Inventors: Avinash Gutta, Pondicherry (IN); Alan Gillespie, East Lothian (GB); Roderick McLachlan, Edinburgh (GB)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 13/770,064

(22) Filed: Feb. 19, 2013

(65) Prior Publication Data

US 2014/0232580 A1    Aug. 21, 2014

(51) Int. Cl.
| | | |
|---|---|---|
| H03M 1/00 | (2006.01) |
| H03K 3/356 | (2006.01) |
| H03M 1/66 | (2006.01) |
| H03K 17/00 | (2006.01) |

(52) U.S. Cl.
CPC .......... *H03K 3/356139* (2013.01); *H03M 1/66* (2013.01); *H03K 17/00* (2013.01)
USPC .......................................... 341/136; 341/144

(58) Field of Classification Search
CPC ...................................................... H03M 1/78
See application file for complete search history.

(56) References Cited

U.S. PATENT DOCUMENTS

| | | | | |
|---|---|---|---|---|
| 4,800,365 A | * | 1/1989 | White et al. | 341/119 |
| 5,075,677 A | | 12/1991 | Meaney | |
| 5,387,912 A | * | 2/1995 | Bowers | 341/118 |
| 5,764,174 A | * | 6/1998 | Dempsey et al. | 341/154 |
| 6,587,065 B1 | * | 7/2003 | Hensley et al. | 341/161 |
| 7,420,857 B2 | * | 9/2008 | Hirota et al. | 365/189.09 |
| 7,884,747 B2 | | 2/2011 | McLachlan | |
| 8,537,043 B1 | * | 9/2013 | McLachlan et al. | 341/144 |

OTHER PUBLICATIONS

ADI 5060: Fully Accurate 14-/16-Bit VOUT nanoDAC™ SPI Interface 2.7 V to 5.5 V, in an SOT-23. 2010.

\* cited by examiner

*Primary Examiner* — Brian Young
(74) *Attorney, Agent, or Firm* — Kenyon & Kenyon, LLP

(57) ABSTRACT

A data converter can include a resistor network, a switch network connected to the resistor network and having a plurality of switch circuits, each with an NMOS and a PMOS switch transistor, and a voltage generator to generate a drive voltage for driving a gate of at least one of the NMOS or PMOS switch transistors of at least one of the switch circuits. The voltage generator can include first and second pairs of transistors, each pair having connected control terminals and being connected to a second NMOS or PMOS transistor, a first or second resistor, and the other pair of transistors. The first and second resistors can have substantially equal resistance values. A ratio of width-to-length ratios of the second NMOS to PMOS transistors can be substantially equal to such a ratio of the switch circuit NMOS to PMOS transistors.

23 Claims, 4 Drawing Sheets

FIG. 6

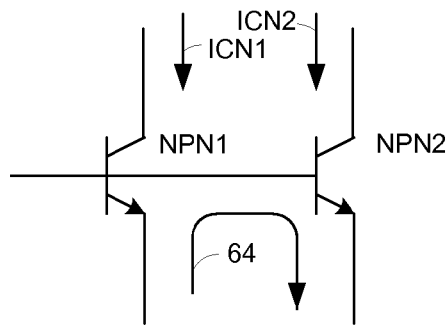 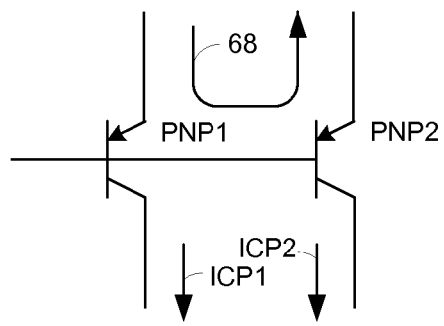
FIG. 5A
FIG. 5B
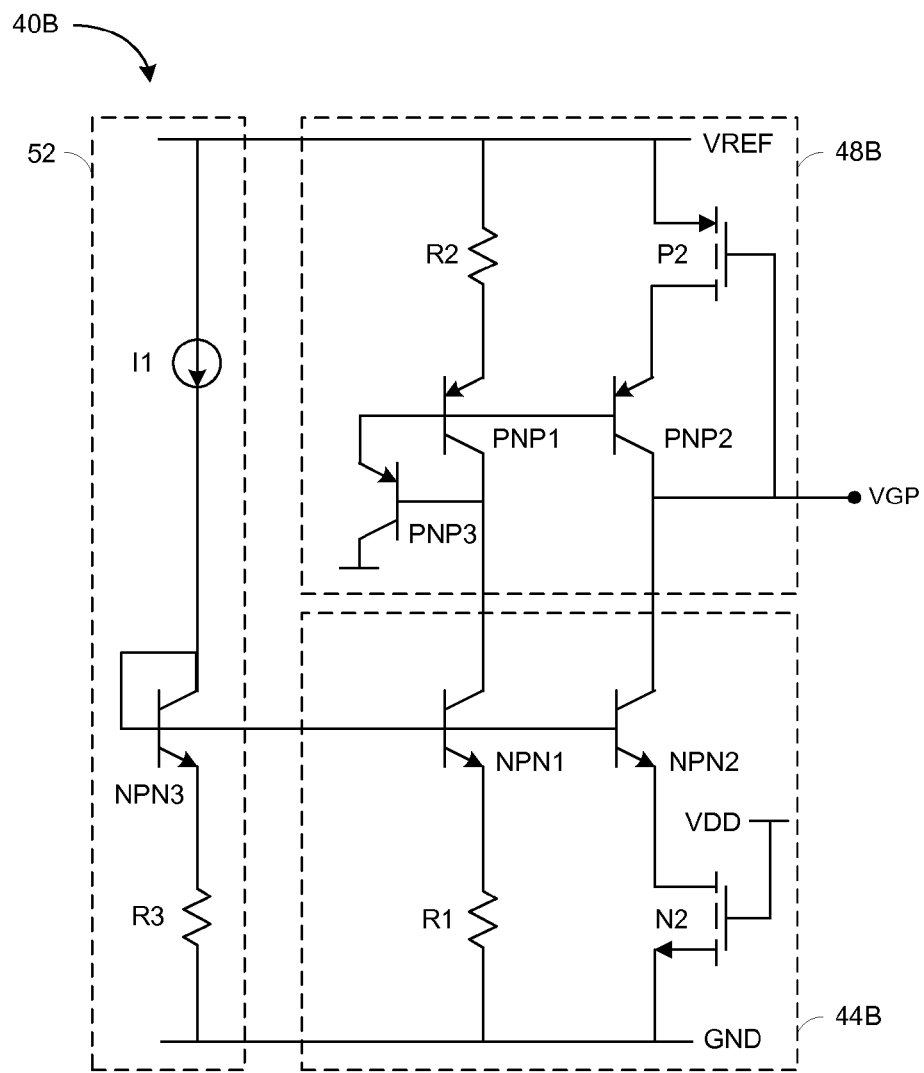
FIG. 6

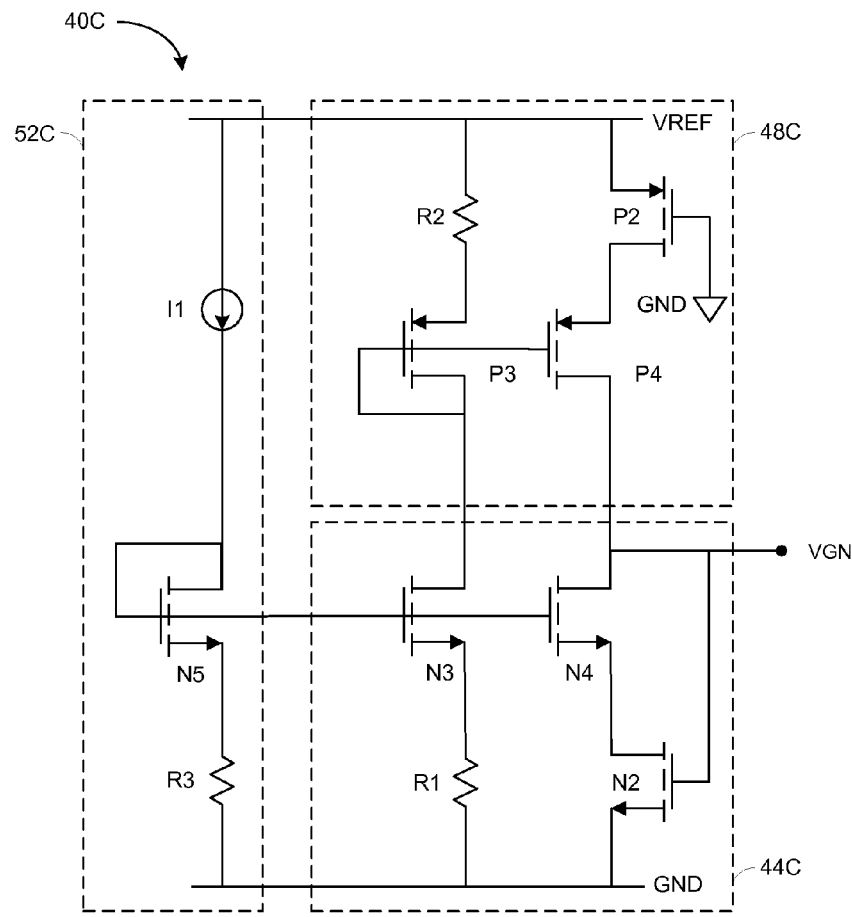
FIG. 7
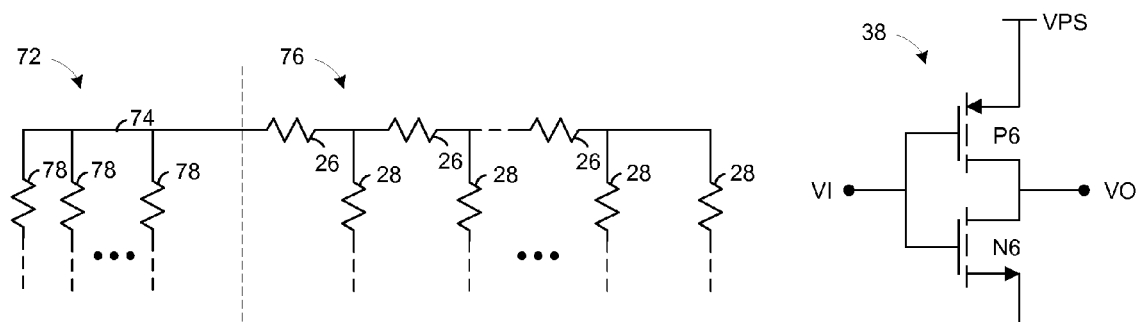
FIG. 8
FIG. 9

VOLTAGE GENERATOR, SWITCH AND DATA CONVERTER CIRCUITS

BACKGROUND

Switch networks are often used in data converters, such as digital-to-analog converters and analog-to-digital converters, to selectively connect resistors, currents and voltages within the converter based on values of individual bits of a digital word. In a common scenario, a single-pole, double-throw switch connects one terminal of resistor to either one of two different voltages, such as a reference voltage and ground, based on the value of a given bit. The single-pole, double-throw switch is typically implemented using a complimentary pair of MOS transistors, including an NMOS and a PMOS transistor, with sources and drains connected to the resistor terminal and the voltages, and gates connected to a complimentary pair of control signals derived from the corresponding digital bit.

One problem with these architectures is that, to preserve linearity and other performance metrics of the converter, the complimentary MOS switch transistors typically should each present the same "on" resistance, from source to drain, when activated to connect the resistor to the respective voltage. However, NMOS and PMOS transistors often inherently present different on resistances when driven under symmetrically similar conditions.

Prior efforts to force NMOS and PMOS switch transistors to present the same on resistance have resulted in relatively area- and power-inefficient circuits. Therefore, there exists a need for area- and power-efficient circuits to drive complimentary MOS switch transistors, in data converters and other circuits, in a manner to substantially equalize, or alternatively place into a predetermined relationship relative to each other, on resistances among these switch transistors.

BRIEF DESCRIPTION OF THE DRAWINGS

FIGS. 5A and 5B are circuit schematics depicting embodiments of connected-base bipolar transistor pairs of subcircuits of the voltage generator.

FIG. 6 is a circuit schematic depicting another embodiment of the voltage generator.

FIG. 7 is a circuit schematic depicting yet another embodiment of the voltage generator.

FIG. 8 is a circuit schematic depicting another embodiment of the resistor network.

FIG. 9 is a circuit schematic depicting an embodiment of a driver circuit.

DETAILED DESCRIPTION

An embodiment of a data converter includes a resistor network, a switch network connected to the resistor network, and a voltage generator to generate a drive voltage at an output terminal for driving switch transistors of switch circuits of the switch network. The switch circuits can each include NMOS and PMOS switch transistors, connected to a corresponding resistor of the resistor network, and a driver circuit to receive and drive at least one of the NMOS or PMOS switch transistors to the generated drive voltage. The voltage generator can include first and second subcircuits, each including a pair of transistors connected at their control terminals and connected to a resistor and a second NMOS or PMOS transistor. The voltage generator can generate an output voltage, at a gate of at least one of the second NMOS or PMOS transistors, having a value that produces substantially equal on resistances in the second NMOS and PMOS transistors under substantially the same operating conditions faced by the switch circuit NMOS and PMOS transistors, thus producing substantially equal on resistances in the switch circuit NMOS and PMOS transistors when driven using the generated drive voltage.

Figure 1:
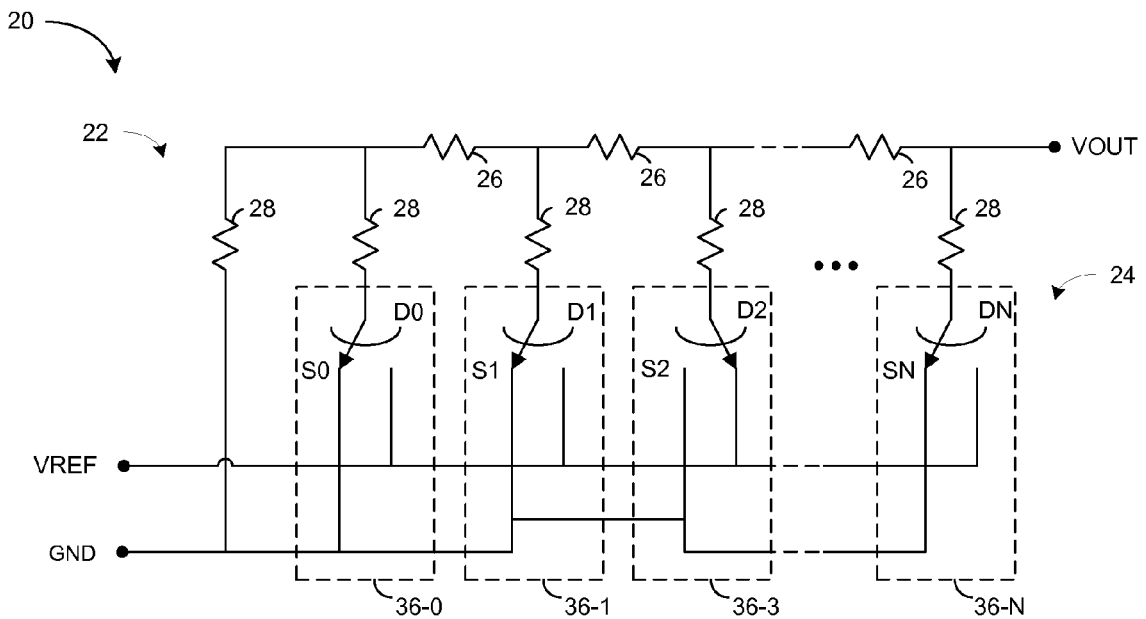
FIG. 1 is a circuit schematic depicting an embodiment of resistor and switch networks of a digital-to-analog converter.

FIG. 1 depicts an embodiment of resistor and switch networks 22, 24 of a digital-to-analog converter (DAC) 20. The DAC 20 receives a digital input, having a plurality of bits D0 . . . DN, and generates an analog output VOUT corresponding to an analog representation of the digital input scaled to a selected reference voltage VREF.

The depicted resistor network 22 includes an R-2R resistor ladder, having a plurality of first resistors 26 with a first resistance value interconnected with a plurality of second resistors 28 with a second resistance value. The second resistance value is substantially equal in magnitude to twice the first resistance value. The resistor network 22 has a first node connected to the reference voltage VREF, a second node connected as an output terminal to deliver the analog output voltage VOUT, and a plurality of nodes connected to switches S0 . . . SN of the switch network 24.

The depicted switch network 24 includes a plurality of switch circuits 36-0 . . . 36-N, each including a single-pole, double-throw switch S0 . . . SN connected between a resistor 28 of the resistor network 22 at a common terminal and the reference voltage VREF and ground GND at pair of second terminals. Each switch S0 . . . SN electrically connects the corresponding resistor terminal to either the reference voltage VREF or ground GND based on the value of the corresponding digital bit D0 . . . DN.

Figure 2:
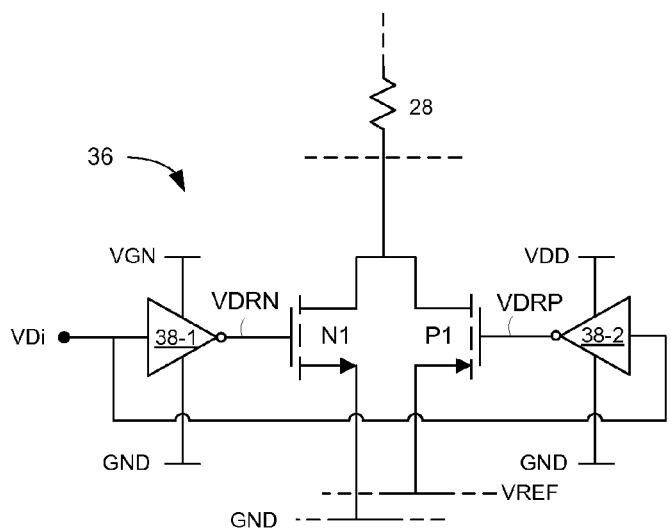
FIG. 2 is a circuit schematic depicting an embodiment of a switch circuit of the switch network.

FIG. 2 depicts an embodiment of a switch circuit 36 that can be used to implement the switch circuits 36-1 . . . 36-N of the switch network 24. The switch circuit 36 includes a pair of MOS transistors N1, P1 and a pair of driver circuits 38-1, 38-2. The pair of MOS transistors includes an NMOS transistor N1 and a PMOS transistor P1, the NMOS transistor having a drain and source connected to the corresponding resistor 28 and ground GND, and a gate connected to and receiving a first drive signal VDRN from a first driver circuit 38-1; the PMOS transistor P1 having a drain and source connected to the resistor 28 and the reference voltage VREF1, and a gate connected to and receiving a second drive signal VDRP from a second driver circuit 38-2.

Each of the driver circuits 38-1, 38-2 can include an inverter having an input connected to and receiving a control signal VDi representing the corresponding digital bit D0 . . . DN, and an output connected to and driving gates of the NMOS or PMOS transistors N1, P1. More specifically, the first driver circuit 38-1 can drive the gate of the NMOS transistor N1, via the first drive signal VDRN, selectively to either a generated drive voltage VGN or ground GND. The second driver circuit 38-2 can drive the gate of the PMOS transistor P1, via the second drive signal VDRP, selectively to either an upper power supply voltage VDD or ground GND.

Figure 3:
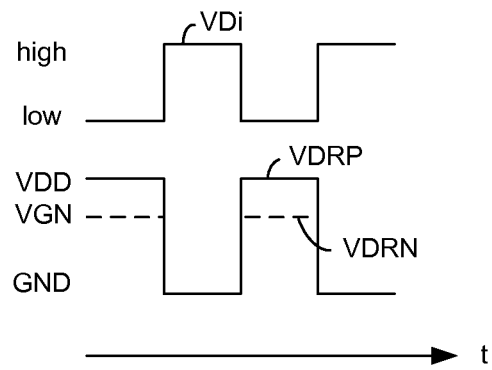
FIG. 3 is a signal diagram depicting an embodiment of control and drive signals of the switch circuit.

In operation, the first and second driver circuits 38-1, 38-2 each produce corresponding drive signals VDRN, VDRP to selectively enable and disable the NMOS and PMOS transistors N1, P1 as a function of the corresponding digital bit D0 . . . DN. FIG. 3 depicts embodiments of the received digital control signal VDi and corresponding produced drive signals VDRN, VDRP. In the depicted diagram, for a logic high value of the received digital control signal VDi, the first driver circuit 38-1 produces a first drive signal value substantially equal to, or driving the gate of the NMOS transistor toward, ground GND, to disable the NMOS transistor N1 and thus electrically disconnect the resistor 28 from ground GND. For a logic low value of the digital control signal VDi, the first driver circuit 38-1 produces a first drive signal value substantially equal to, or driving the gate of the NMOS transistor N1 toward, the generated drive voltage VGN, to enable the NMOS transistor and thus electrically connect the resistor 28 to ground GND. In a similar way, the second driver circuit 38-2 produces second drive signal values substantially equal to, or driving the gate of the PMOS transistor P1 toward, ground GND or the upper power supply voltage VDD, for logic high and low values of the digital control signal VDi, respectively, to enable and disable the PMOS transistor P1 and thus electrically connect and disconnect the resistor 28 to the reference voltage VREF. Thus, for any given value of the digital control signal VDi, one or the other of the NMOS and PMOS transistors N1, P1 can be enabled, and the other disabled.

When the NMOS transistor N1 is enabled, it presents an on resistance RN between its drain and source, and thus between the resistor 28 and ground GND, having a value as a function of the gate-to-source voltage VGSN driving the NMOS transistor N1 in this state, or RN=f(VGSN). This gate to source voltage can be substantially equal to the difference between the generated drive voltage VGN and ground GND, or VGSN=VGN. Similarly, when the PMOS transistor P1 is enabled, it presents an on resistance RP between its source and drain, and thus between the resistor 28 and the reference voltage VREF, having a value as a function of the gate-to-source voltage VGSP driving the PMOS transistor P1 in this state, or RP=f(VGSP). This gate-to-source voltage can be substantially equal to the difference between ground GND and the reference voltage VREF, or VGSP=−VREF.

To make the NMOS on resistance RN substantially equal to the PMOS on resistance RP, one or more of VGN and VREF can be selected to give RN=RP, or RN=f(VGN)=RP=f(−VREF). However, in some embodiments, the reference voltage VREF may be constrained by other performance specifications of the data converter, and thus adjusting the generated drive voltage VGN may be the only or the most attractive option.

The voltage generator generates one or more drive voltages having values selected to equalize, or alternatively place into a predetermined relationship relative to each other, the values of the NMOS and PMOS on resistances RN, RP when driven with the generated drive voltages. In some embodiments, the voltage generator generates only a single drive voltage, such as the NMOS drive voltage VGN or a PMOS drive voltage VGP (see FIG. 6), and another voltage, such as ground GND or an upper or lower power supply voltage VDD, VSS, can be used to produce the other of the NMOS or PMOS drive signal values. In such embodiments, the generated drive voltage is generated to have a value that works together with the other voltage to substantially equate, or alternatively place in a predetermined relationship relative to each other, the NMOS and PMOS on resistances RN, RP. In other embodiments, the voltage generator generates both NMOS and PMOS drive voltages VGN, VGP for provision to the first and second driver circuits 38-1, 38-2, the drive voltages VGN, VGP generated to have values that work together to substantially equate, or alternatively place in a predetermined relationship relative to each other, the NMOS and PMOS on resistances RN, RP.

Figure 4:
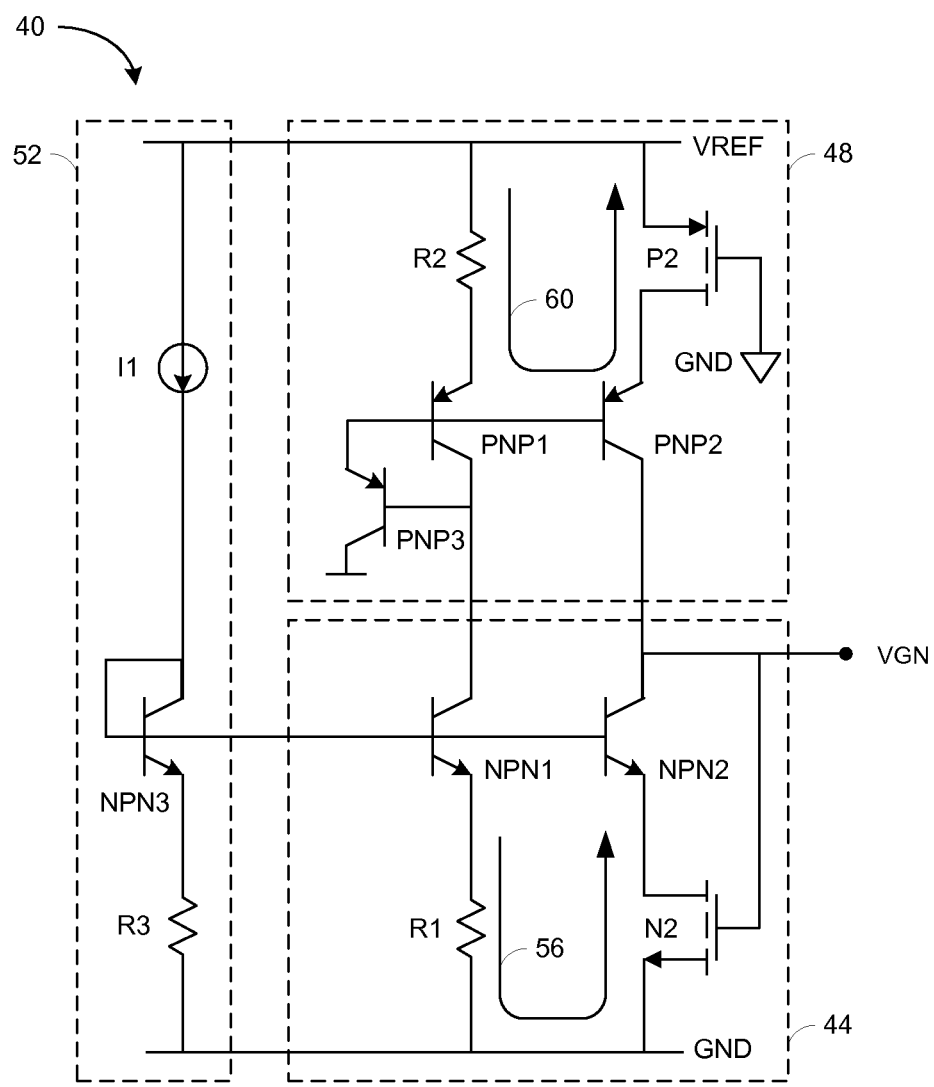
FIG. 4 is a circuit schematic depicting an embodiment of a voltage generator to generate a drive voltage for the switch circuit.

FIG. 4 depicts an embodiment of the voltage generator 40 configured to generate the NMOS drive voltage VGN having a value selected to equalize the NMOS and PMOS on resistances RN, RP when the corresponding PMOS drive signal value is substantially equal to ground GND, as in the embodiment of FIG. 2. The depicted embodiment of the voltage generator 40 includes a first subcircuit 44, a second subcircuit 48, and a biasing branch 52.

Each of the first and second subcircuits 44, 48 includes a pair of transistors that are connected together at their control terminals, connected to a resistor and a MOS transistor at another terminal, and connected to the other subcircuit 44, 48 at a third terminal. The transistor pairs can be either bipolar or MOS transistor pairs. In the embodiment of FIG. 4, the transistor pairs are bipolar transistors, and thus each of the first and second subcircuits 44, 48 includes a pair of bipolar transistors that are connected together at their bases, connected to a resistor and a MOS transistor at their emitters, and connected to the other subcircuit 44, 48 at their collectors. In more detail, the first subcircuit 44 includes a pair of NPN bipolar transistors NPN1, NPN2, connected together at their bases, a first NPN transistor NPN1 connected to a first resistor R1 at its emitter and to a first PNP transistor PNP1 of the second subcircuit 48 at its collector, and a second NPN transistor NPN2 connected to a drain of an NMOS transistor N2 at its emitter and to a second PNP transistor PNP2 of the second subcircuit 48 at its collector. The second subcircuit 48 includes a pair of PNP bipolar transistors PNP1, PNP2, connected together at their bases, a first PNP transistor PNP1 connected to a second resistor R2 at its emitter and to the first NPN transistor NPN1 of the first subcircuit 44 at its collector, and a second PNP transistor PNP2 connected to a drain of a PMOS transistor P2 at its emitter and to the second NPN transistor NPN2 of the first subcircuit 44 at its collector. The node connecting the second NPN and PNP transistors NPN2, PNP2 also forms the output terminal of the voltage generator 40, providing the generated NMOS drive voltage VGN.

The NMOS transistor N2 of the first subcircuit 44 can have its gate connected in a feedback configuration to the output node, and its source connected to ground, while the PMOS transistor P2 of the second subcircuit 48 can have its gate connected to ground and its source to the reference voltage VREF. These gate and source connections can replicate those of the NMOS and PMOS switch transistors N1, P1 of the switch circuit 36. The second subcircuit 48 can also include a third PNP transistor PNP3 forming a feedback connection about the base and collector of the first PNP transistor PNP1.

The depicted biasing branch 52 includes a current source I1 feeding a diode-connected NPN transistor NPN3 and a third resistor R3. The diode-connected NPN transistor NPN3 is connected to the third resistor R3 at its emitter and provides a bias voltage to the bases of the NPN transistors NPN1, NPN2 of the first subcircuit 44.

In operation, the voltage generator NMOS and PMOS transistors N2, P2 can replicate the connections and operation of the switch circuit NMOS and PMOS transistors N1, P1, and the first and second subcircuits 44, 48 can operate internally and cooperate with each other to generate the NMOS drive voltage VGN at the gate of the voltage generator NMOS transistor N2, and thus at the voltage generator output, having a value that drives the voltage generator NMOS transistor N2, and thus due to the replication the switch circuit NMOS transistor N1 as well, in a state in which its on resistance is substantially equal to that of the voltage generator PMOS transistor P2 and the switch circuit PMOS transistor P1, when their gates are driven to ground. This functionality is explained in more detail as follows.

FIGS. 5A and 5B depict embodiments of the base-connected bipolar transistors of the first and second subcircuits 44, 48 shown in isolation. Travelling from an emitter terminal of one of the bipolar transistors in a connected pair through to the emitter terminal of the other transistor in the pair, as along paths 64, 68, a voltage change experienced can be represented as:

$$\Delta VBE = VE1 - VE2 = \ln(IC1/IC2), \quad (1)$$

where $\Delta VBE$ is the voltage difference between the emitter terminals, VE1 is the voltage at an emitter terminal of the first of the transistor pair, VE2 is a voltage at an emitter terminal of the second of the transistor pair, IC1 is a collector current of a first of the transistor pair, IC2 is a collector current of a second of the transistor pair, and ln indicates the natural logarithm operation. Thus, for the NPN pair depicted in FIG. 5A:

$$\Delta VBEN = VEN1 - VEN2 = \ln(ICN1/ICN2), \quad (2)$$

where $\Delta VBEN$ is the voltage difference between the emitter terminals of the NPN pair, VEN1 is the voltage at the emitter terminal of the first NPN transistor NPN1, VEN2 is a voltage at the emitter terminal of the second NPN transistor NPN2, ICN1 is the collector current of the first NPN transistor NPN1, and ICN2 is the collector current of the second NPN transistor NPN2. For the PNP pair depicted in FIG. 5B:

$$\Delta VBEP = VEP1 - VEP2 = \ln(ICP1/ICP2), \quad (3)$$

where $\Delta VBEP$ is the voltage difference between the emitter terminals of the PNP pair, VEP1 is the voltage at the emitter terminal of the first PNP transistor PNP1, VEP2 is a voltage at the emitter terminal of the second PNP transistor PNP2, ICP1 is the collector current of the first PNP transistor PNP1, and ICP2 is the collector current of the second PNP transistor PNP2.

Returning to FIG. 4, writing a Kirchhoff's voltage law (KVL) equation about a path 56 of the first subcircuit 44 yields:

$$VBEN1 + IE1R1 = VBEN2 + IE2RN2, \quad (4)$$

where VBEN1 is the voltage difference from the base to emitter of the first NPN transistor NPN1, VBEN2 is the voltage difference from the base to emitter of the second NPN transistor NPN2, IE1 is the emitter current in the first NPN transistor NPN1, IE2 is the emitter current in the second NPN transistor NPN2, and RN2 is the on resistance of the voltage generator NMOS transistor N2. For sufficiently large bipolar transistor betas, the emitter currents IE1, IE2 of the first and second NPN transistors NPN1, NPN2 can be substantially equal to collector currents IC1, IC2 of these transistors, or IE1=IC1 and IE2=IC2. Thus, equation (4) can be rewritten to yield:

$$VBEN1 + IC1R1 = VBEN2 + IC2RN2, \quad (5)$$

It can also be assumed that the base current of the third PNP transistor PNP3, e.g., for sufficiently large bipolar transistor betas, and the gate current of the NMOS transistor N2, as well as any output current at the output node, can be substantially ignored, and thus that the collector currents of the first NPN and PNP transistors NPN1, PNP1, as well as the collector currents of the second NPN and PNP transistors NPN2, PNP2, are respectively substantially equal. Equation (5) can then be rearranged, and the quantity VBEN1−VBEN2 substituted according to equation (2), to yield:

$$IC1R1 + \ln(IC1/IC2) = IC2RN2. \quad (6)$$

A similar equation can be derived for the second subcircuit 48, yielding:

$$IC1R2 + \ln(IC1/IC2) = IC2RP2, \quad (7)$$

where RP2 is the on resistance of the voltage generator PMOS transistor P2. Combining equations (6) and (7) yields:

$$IC1(R1-R2) = IC2(RN2-RP2). \quad (8)$$

From equation (8), it can be seen that, to substantially equalize the on resistances RN2, RP2 of the voltage generator NMOS and PMOS transistors N2, P2, the resistance values of the first and second resistors R1, R2 can be selected to be substantially equal. In other embodiments, other relationships between the on resistances RN2, RP2 of the voltage generator NMOS and PMOS transistors N2, P2 can be selected by selecting values of the first and second resistances R1, R2 and the first and second collector currents IC1, IC2 to implement the desired relationship according to equation (8).

Summarizing, the similar structure of the first and second subcircuits 44, 48 leads to similar KVL equations for these subcircuits 44, 48, which equations are further simplified by the nature of the relationship between base-emitter voltages and collector currents in base-connected bipolar transistors, as discussed in connection with FIGS. 5A and 5B, and then the coupling of the first and second subcircuits 44, 48, resulting in substantially equal first and second collector currents IC1, IC2 shared by these circuits, yields equation (8), which can be manipulated in various ways to yield voltage generator NMOS and PMOS on resistances RN2, RP2, that are substantially equal, or alternatively have a predetermined relationship to each other, by selecting the first and resistances R1, R2 to be substantially equal, or alternatively to have other relationships to each other.

The replication by the voltage generator NMOS and PMOS transistors N2, P2 of the operation of the NMOS and PMOS switch transistors N1, P1 results in the relationship between the on resistances RN2, RP2 implemented in the voltage generator 40 also being implemented between the NMOS and PMOS switch transistor on resistances RN, RP when the generated drive voltage VGN is used to enable the NMOS switch transistor N1 in FIG. 2. To replicate the operation of the NMOS and PMOS switch transistors N1, P1, the connections and relative sizing of the voltage generator NMOS and PMOS transistors N2, P2 can replicate the connections and relative sizing of the NMOS and PMOS switch transistors N1, P1.

In the embodiment of FIG. 4, the connections of the voltage generator NMOS and PMOS transistors N2, P2 have been configured to replicate those of the NMOS and PMOS switch transistors N1, P1 when the NMOS switch transistor N1 is enabled with a gate driven to the generated drive voltage VGN and a source supplied with ground GND, and the PMOS switch transistor P1 is enabled with a gate driven to ground GND and a source supplied with the reference voltage VREF. In other embodiments, the connections of the voltage generator NMOS and PMOS transistors N2, P2 can also be configured to replicate those of the NMOS and PMOS switch transistors N1, P1 even when other than as depicted in FIG. 2.

The voltage generator NMOS and PMOS transistors N2, P2 can also replicate the operation of the NMOS and PMOS switch transistors N1, P1 by replicating their relative sizing. Generally speaking, a transistor has a size characterized by a width W and a length L, and many operating characteristics of transistors can be characterized as a function of a ratio of the width W to the length L, or W/L. To replicate the operation of the NMOS and PMOS switch transistors N1, P1, the relationship between the width-to-length ratios W/L of the voltage generator NMOS and PMOS transistors N2, P2 can replicate the relationship between the width-to-length ratios of the NMOS and PMOS switch transistors N1, P1.

If the NMOS switch transistor N1 has a width-to-length ratio of J and the PMOS switch transistor P1 has a width-to-length ratio of K, where J and K are any numbers, resulting in the ratio of the switch circuit NMOS to PMOS width-to-length ratios being J/K, the voltage generator NMOS and PMOS transistors N2, P2 can be selected to also have a ratio of NMOS to PMOS width-to-length ratios of J/K. For example, the voltage generator NMOS transistor N2 can have a width-to-length ratio of J and the voltage generator PMOS transistor P2 can have a width-to-length ratio of K. In another example, the voltage generator NMOS transistor N2 can have a width-to-length ratio of X J and the voltage generator PMOS transistor P2 can have a width-to-length ratio of X K, where X is any number. Various specific transistor sizes can be used to achieve these various ratios.

The voltage generator can also alternatively generate a PMOS drive voltage VGP to drive the PMOS switch transistor P1 when the NMOS switch transistor N1 is driven by another voltage, such an upper power supply voltage VDD. FIG. 6 depicts an embodiment of the voltage generator 40B that is substantially similar to the embodiment depicted in FIG. 4, but in which the connections of the first and second subcircuits 44B, 48B are changed to generate a PMOS drive voltage VGP that substantially equalizes the voltage generator NMOS and PMOS on resistances when the NMOS switch transistor N1 is driven using an upper power supply voltage VDD. In FIG. 6, the PMOS transistor P2 now has a feedback configuration in which it's gate is connected to the output terminal, and the NMOS transistor N2 has a fixed voltage, the upper power supply voltage VDD, supplied to its gate.

Other embodiments of the voltage generator may generate both NMOS and PMOS drive voltages VGN, VGP, by combining, and inserting a circuit element such as a diode-connected transistor in between, the first subcircuit 44 from FIG. 4 and the second subcircuit 48B from FIG. 6.

The voltage generator can also be implemented using CMOS transistors instead of bipolar transistors in the first and second subcircuits. FIG. 7 depicts an embodiment of the voltage generator 40C having first and second subcircuits 44C, 48C in which the base-connected NPN transistors NPN1, NPN2 and base-connected PNP transistors PNP1, PNP2 of the first and second subcircuits 44, 48 of FIG. 4 are replaced with gate-connected NMOS transistors N3, N4, and gate-connected PMOS transistors P3, P4. In FIG. 7, the biasing branch 52C is also implemented using an NMOS transistor N5. In a similar manner, the embodiment of the voltage generator 40B of FIG. 6 can also be implemented using CMOS transistors instead of bipolar transistors. In other embodiments, various combinations of CMOS and bipolar transistors can be used.

The voltage generator and switch network can be included in a variety of different types of circuits, such as various different types of digital-to-analog converters, analog-to-digital converters, and general switching circuits. The voltage generator can also itself be included in various different types of circuits independent of the switch network.

A data converter including embodiments of the voltage generator can include various types and configurations of resistor and switch networks. For example, a hybrid data converter can include a resistor network having a plurality of different resistor network portions. FIG. 8 depicts an embodiment of a resistor network of a hybrid converter. The depicted resistor network has a first resistor network portion 72 having a plurality of substantially equal-valued resistors 78 connected together at a first node 74, and a second resistor network portion 76 substantially similar to the R-2R ladder of FIG. 1.

FIG. 9 depicts an embodiment of a driver circuit 38 that can be used to implement the first and second driver circuits 38-1, 38-2. The depicted driver circuit 38 includes NMOS and PMOS transistors N6, P6, connected together at gates to receive an input VI and at drains to provide an output VO, and receiving first and second drive voltages VNS, VPS at sources.

Although FIG. 2 depicts the first driver circuit 38-1 as receiving the generated NMOS drive voltage VGN and ground GND at drive voltage terminals to drive, and thus enable and disable, the NMOS switch transistor N1 between these voltages, and the second driver circuit 38-2 as receiving the upper power supply voltage VDD and ground GND at drive voltage terminals to drive, and thus enable and disable, the PMOS switch transistor P1 between these voltages, other drive voltages can be supplied to the first and second drive circuits 38-1, 38-2. For example, in embodiments of the voltage generator 40B that generate the PMOS drive voltage VGP, the first driver circuit 38-1 can receive at drive terminals, and drive the NMOS switch transistor N1 between, an upper power supply voltage VDD and ground GND, and the second driver circuit 38-1 can receive at drive terminals, and drive the PMOS switch transistor P1 between, the upper power supply voltage VDD and the generated PMOS drive voltage VGP. In embodiments in which the voltage generator generates both the NMOS and PMOS drive voltages VGN, VGP, the first driver circuit 38-1 can receive at drive terminals, and drive the NMOS switch transistor N1 between, the NMOS drive voltage VGN and ground GND, and the second driver circuit 38-1 can receive at drive terminals, and drive the PMOS switch transistor P1 between, the upper power supply voltage VDD and the generated PMOS drive voltage VGP.

Other configurations of the biasing branch are possible, such as configurations in which the biasing branch biases the transistor pairs of the second subcircuit instead of the first subcircuit. For example, alternative biasing branch embodiments may include a PNP or PMOS transistor instead of the NPN transistor NPN3 or NMOS transistor N5 shown in FIGS. 4, 6 and 7. Such a PNP or PMOS biasing transistor can be connected to a corresponding current source at its collector or drain and to the connected bases of the first and second PNP transistors PNP1, PNP2, or the connected gates of PMOS transistors P3, P4, of embodiments of the second subcircuit 48, 48B. In such cases, the third PNP transistor PNP3 and the gate-to-drain connection of the PMOS transistor P3 can be omitted, and a similarly connected NPN transistor or gate-to-drain connection can be added about the first NPN transistor NPN1 or NMOS transistor N3.

Embodiments of a data converter having the voltage generator can include the resistor and switch networks substantially as configured in FIG. 1, but instead of the switch network switching resistor terminals between a reference voltage VREF and ground GND, the switch network can switch the resistor terminals between first and second references voltages VREF, VREF2. In such an embodiment, the second reference voltage VREF2 may also replace ground GND at other nodes of the resistor or switch networks or voltage generator.

The switch network can also include other types of switches, instead of single-pole double-throw switches, that include NMOS and PMOS switch transistors to be driven by one or more of the NMOS or PMOS drive voltages VGN, VGP generated by the voltage generator.

In various embodiments, a lower power supply voltage VSS can be used instead of ground GND.

Additional embodiments of the data converter, switching, and voltage generator circuits discussed herein are also possible. For example, any feature of any of the embodiments of the data converter, switching, and voltage generator circuits described herein can optionally be used in or with any other feature or embodiment of the data converter, switching, and voltage generator circuits. Embodiments of the data converter, switching, and voltage generator circuits can also optionally include any subset of the components or features of any embodiments of the data converter, switching, and voltage generator circuits described herein.

What is claimed is:

1. A digital-to-analog converter circuit, comprising:
   a resistor network including a plurality of interconnected resistors;
   a switch network connected to the resistor network, the switch network including a plurality of switch circuits, each having an NMOS and a PMOS switch transistor; and
   a voltage generator to generate a drive voltage at an output terminal for driving a gate of at least one of the NMOS or PMOS switch transistors of at least one of the switch circuits, the voltage generator including:
      a first pair of bipolar transistors, having connected bases and being connected to a second NMOS transistor and a first resistor; and
      a second pair of bipolar transistors, having connected bases and being connected to a second PMOS transistor, a second resistor and the first pair of transistors.

2. The digital-to-analog converter circuit of claim 1, wherein the first pair of transistors are NPN bipolar transistors having connected bases and the second pair of transistors are PNP bipolar transistors having connected bases.

3. The digital-to-analog converter circuit of claim 1, wherein the generated drive voltage drives the gate of the at least one of the NMOS or PMOS switch transistors such that the at least one of the NMOS or PMOS switch transistors has an on resistance substantially equal to that of the other of the NMOS and PMOS switch transistors when the other of the NMOS and PMOS switch transistors has a gate driven with at least one of: a supply voltage, a reference voltage or another generated drive voltage.

4. The digital-to-analog converter circuit of claim 1, wherein a gate of one of the second NMOS or second PMOS transistors is connected to the output terminal of the voltage generator, and the generated drive voltage is a gate-to-source voltage of the one of the second NMOS or second PMOS transistors.

5. The digital-to-analog converter circuit of claim 4, wherein at least one of the switch circuits includes a pair of driver circuits to drive the NMOS and PMOS switch transistors to the generated drive voltage and a predetermined second drive voltage, a gate of the other the second NMOS or PMOS transistors connected to the predetermined second drive voltage.

6. The digital-to-analog converter circuit of claim 1, wherein the first and second resistors have substantially equal resistance values.

7. A digital-to-analog converter circuit, comprising:
   a resistor network including a plurality of interconnected resistors;
   a switch network connected to the resistor network, the switch network including a plurality of switch circuits, each having an NMOS and a PMOS switch transistor; and
   a voltage generator to generate a drive voltage at an output terminal for driving a gate of at least one of the NMOS or PMOS switch transistors of at least one of the switch circuits, the voltage generator including:
      a first pair of transistors, having connected control terminals and being connected to a second NMOS transistor and a first resistor; and
      a second pair of transistors, having connected control terminals and being connected to a second PMOS transistor, a second resistor and the first pair of transistors,
   wherein a ratio of the second NMOS transistor's width-to-length ratio to the second PMOS transistor's width-to-length ratio is substantially equal to a ratio of the switch circuit NMOS transistor's width-to-length ratio to the switch circuit PMOS transistor's width-to-length ratio.

8. The digital-to-analog converter circuit of claim 1, wherein a ratio of the second NMOS transistor's width-to-length ratio to the second PMOS transistor's width-to-length ratio has a predetermined relationship to a ratio of the switch circuit NMOS transistor's width-to-length ratio to the switch circuit PMOS transistor's width-to-length ratio.

9. The digital-to-analog converter circuit of claim 1, wherein the resistor network includes at least one of a first portion or a second portion, the first portion including an R-2R resistor ladder and the second portion including a plurality of substantially equal-valued resistors connected to a common node.

10. A voltage generator circuit, comprising:
    a pair of NPN bipolar transistors, having connected bases and being connected to an NMOS transistor and a first resistor; and
    a pair of PNP bipolar transistors, having connected bases and being connected to a PMOS transistor, a second resistor and the pair of NPN bipolar transistors.

11. A voltage generator circuit to generate a drive voltage, the voltage generator circuit comprising:
    a first pair of transistors, having connected control terminals and being connected to an NMOS transistor and a first resistor; and
    a second pair of transistors, having connected control terminals and being connected to a PMOS transistor, a second resistor and the first pair of transistors,
    wherein a gate of one of the NMOS or PMOS transistors is connected to an output terminal of the voltage generator circuit, and the generated drive voltage is a gate-to-source voltage of the one of the NMOS or PMOS transistors.

12. The voltage generator circuit of claim 10, wherein the first and second resistors have substantially equal resistance values.

13. A switching circuit, comprising:
    a switch network connected to a resistor network, the switch network including a plurality of switch circuits, each having an NMOS and a PMOS switch transistor; and
    a voltage generator to generate a drive voltage at an output terminal for driving a gate of at least one of the NMOS or PMOS switch transistors of at least one of the switch circuits, the voltage generator including:
       a first pair of bipolar transistors, having connected bases and being connected to a second NMOS transistor and a first resistor; and a second pair of bipolar transistors, having connected bases and being connected to a second PMOS transistor, a second resistor and the first pair of transistors.

14. The switching circuit of claim 13, wherein the first pair of transistors are NPN bipolar transistors having connected bases and the second pair of transistors are PNP bipolar transistors having connected bases.

15. The switching circuit of claim 13, wherein a gate of one of the second NMOS or second PMOS transistors is connected to the output terminal of the voltage generator, and the generated drive voltage is a gate-to-source voltage of the one of the second NMOS or second PMOS transistors.

16. The switching circuit of claim 15, wherein at least one of the switch circuits includes a pair of driver circuits to drive the NMOS and PMOS switch transistors to the generated drive voltage and a predetermined second drive voltage, wherein a gate of the other the second NMOS and second PMOS transistors is connected to the predetermined second drive voltage.

17. The switching circuit of claim 13, wherein the first and second resistors have substantially equal resistance values.

18. A switching circuit, comprising:
a switch network connected to a resistor network, the switch network including a plurality of switch circuits, each having an NMOS and a PMOS switch transistor; and
a voltage generator to generate a drive voltage at an output terminal for driving a gate of at least one of the NMOS or PMOS switch transistors of at least one of the switch circuits, the voltage generator including:
 a first pair of transistors, having connected control terminals and being connected to a second NMOS transistor and a first resistor; and
 a second pair of transistors, having connected control terminals and being connected to a second PMOS transistor, a second resistor and the first pair of transistors,
wherein a ratio of the second NMOS transistor's width-to-length ratio to the second PMOS transistor's width-to-length ratio is substantially equal to a ratio of the switch circuit NMOS transistor's width-to-length ratio to the switch circuit PMOS transistor's width-to-length ratio.

19. The switching circuit of claim 13, wherein a ratio of the second NMOS transistor's width-to-length ratio to the second PMOS transistor's width-to-length ratio has a predetermined relationship to a ratio of the switch circuit NMOS transistor's width-to-length ratio to the switch circuit PMOS transistor's width-to-length ratio.

20. The digital-to-analog converter circuit of claim 1, wherein the first pair of bipolar transistors are connected at emitters to the second NMOS transistor and the first resistor, and the second pair of bipolar transistors are connected at emitters to the second PMOS transistor and the second resistor.

21. The digital-to-analog converter circuit of claim 1, wherein collectors of the first pair of bipolar transistors are connected to collectors of the second pair of bipolar transistors.

22. A voltage generator circuit, comprising:
a pair of NMOS transistors, having connected gates and each being connected at a source to a respective one of a third NMOS transistor or a first resistor; and
a pair of PMOS transistors, having connected gates and each being connected at a source to a respective one of a third PMOS transistor or a second resistor,
wherein the pair of NMOS transistors is connected at drains to drains of the pair of PMOS transistors.

23. The voltage generator circuit of claim 22, wherein a gate of one of the third NMOS or third PMOS transistors is connected to an output terminal of the voltage generator circuit to generate an output voltage as a gate-to-source voltage of the one of the third NMOS or third PMOS transistors.

\* \* \* \* \*